United States Patent [19]

Fukui et al.

[11] Patent Number: 5,264,077
[45] Date of Patent: Nov. 23, 1993

[54] METHOD FOR PRODUCING A CONDUCTIVE OXIDE PATTERN

[75] Inventors: Takashi Fukui; Naoya Sakamoto, both of Atsugi; Takeshi Fukada, Ebina, all of Japan

[73] Assignee: Semiconductor Energy Laboratory Co., Ltd., Kanagawa, Japan

[21] Appl. No.: 970,541

[22] Filed: Nov. 2, 1992

Related U.S. Application Data

[63] Continuation of Ser. No. 537,992, Jun. 13, 1990, abandoned.

[30] Foreign Application Priority Data

Jun. 15, 1989 [JP] Japan ................... 1-152911

[51] Int. Cl.$^5$ ................... B44C 1/22; C23F 1/00
[52] U.S. Cl. ................... 156/659.1; 156/656; 156/667; 204/192.29; 427/309
[58] Field of Search ................... 156/656, 659.1, 667; 427/307, 309; 204/192.15, 192.21, 192.29

[56] References Cited

U.S. PATENT DOCUMENTS

| | | | |
|---|---|---|---|
| 4,332,075 | 6/1982 | Ota et al. | 29/571 |
| 4,419,530 | 12/1983 | Nath | 136/251 |
| 4,448,637 | 5/1984 | Hiraishi et al. | 156/635 |
| 4,646,424 | 3/1987 | Parks et al. | 29/571 |
| 4,842,705 | 6/1989 | Mueller | 204/192.29 |
| 4,887,760 | 12/1989 | Yoshino et al. | 228/56.3 |
| 4,956,023 | 9/1990 | Tsuge et al. | 136/244 |

FOREIGN PATENT DOCUMENTS

| | | |
|---|---|---|
| 0311690 | 4/1989 | European Pat. Off. . |
| 62-086878 | 4/1987 | Japan . |
| 62-295422 | 12/1987 | Japan . |

OTHER PUBLICATIONS

Thin Solid Films, vol. 15, No. 2, Mar. 1989, Lausanne CH, pp. 151–162; M. Venkatesan et al.: "Indium tin oxide thin films for metallization in microelectronic devices".

Journal of Vacuum Science and Technology: Part A. vol. 5, No. 4, Jul. 1987, New York, US pp. 1952-1955; S. Yamamoto et al.: "Properties of Sn-doped In2O3 by reactive magnetron sputtering and subsequent annealing".

*Primary Examiner*—William A. Powell
*Attorney, Agent, or Firm*—Sixbey, Friedman, Leedom & Ferguson

[57] ABSTRACT

A conductive oxide film is formed on a substrate at a low temperature. The formed conductive oxide film is not very dense because of the low temperature. Therefore the formed conductive oxide film can easily be etched by an etchant having a weak etching capability. And by the etching a pattern of the formed conductive oxide film is produced. The patterned conductive oxide film is oxidized at a temperature in the range of 100°–400° C. In this way a conductive oxide pattern is produced in a shorter time in the method of the present invention than in a conventional method and the conductive oxide pattern produced by the method of the present invention has the almost same resistivity as the conductive oxide pattern produced by the conventional method and has an improved pattern edge and an improved reproducibility.

21 Claims, 5 Drawing Sheets

METHOD FOR PRODUCING A CONDUCTIVE OXIDE PATTERN

This application is a continuation of Ser. No. 07/537,992, filed Jun. 13, 1990, now abandoned.

BACKGROUND OF THE INVENTION

1. Field of the Invention

The present invention relates to a method for producing a conductive oxide pattern which can be used in a liquid crystal display or an image sensor or the like.

2. Description of the Prior Art

In recent years, a large-size liquid crystal display and image sensor having a substrate and a conductive oxide pattern on the substrate have become more common. Hand in hand with this trend, the substrate having the conductive oxide pattern have also increased in size. This has led to a high degree of technological innovation in the fabrication of this type of large-area substrate with good efficiency and at low cost.

In a conventional technology for a manufacture of the substrate having the conductive oxide pattern, for example in the case of ITO(indium tin oxide) film, the ITO film is formed on an insulating substrate by commonly known vaporization or sputtering methods. At this time, the substrate is heated to 250° to 400° C. and oxygen is introduced to lower the resistivity and increase the translucent characteristics of the ITO. As the area of the ITO is increased, a further decrease in the resistivity value is required and the temperature at which the ITO film is formed is generally increased. Following this formation of the ITO film, a resist is formed in the specific pattern on the ITO film, using commonly known photolithography technology. Next, etching is performed, using the resist as a mask. For wet etching, etchants such as hydrochloric acid+ferric chloride, hot hydrochloric acid+ferric chloride, are used where zinc powder can be used in place of the ferric chloride. The ITO film is etched by the etchants to render a portion of the ITO film under the resist remain and the substrate having the remaining portion of the ITO film is used in liquid crystal displays, image sensors, and solar cells, and the like. Dry etching is not frequently used because no activated type of etchant has been found which provides a conductive oxide pattern of ITO or the like with good etching efficiency. Also, because the etching rate is low, the dry etching is not suitable and not practically used for processing a large area substrate of liquid crystal displays, solar cells, and the like.

The following problem areas are inherent in these methods. The tact time of the manufacturing process of the ITO film is long. Specifically, after the substrate is set in a vacuum device to form the ITO film, the substrate is heated to a predetermined temperature so a waiting period is necessary. If the temperature of the substrate is suddenly lowered to room temperature after the film has been formed, the formed ITO film tends to peel from the substrate. Therefore the temperature must be reduced gradually. As a result, one batch of ITO film takes a relatively long time to produce. Because the process requires heating in a vacuum, it is difficult to obtain a uniform temperature distribution, therefore it is necessary that a heating device is provided more extensively than the ITO film is formed on the substrate. This increases the size of a reaction chamber. In addition, the reproducibility is poor because of the heating process.

An ITO film which is formed with the substrate heated in this manner is extremely dense and has an extremely low electrical resistance. Accordingly, a powerful etchant is required to etch this ITO film in a predetermined pattern. In addition it is necessary to heat the etchant during the etching process in order to increase the etching rate.

When the ITO film is etched with a powerful etchant of this type, the edge of the etching pattern loses its sharpness and the pattern undulates. Also, a large volume of hydrogen is produced which causes the etching pattern mask to peel away or sustain damage during etching. It is therefore extremely difficult to obtain a fine etching pattern on a large-area substrate.

SUMMARY OF THE INVENTION

An object of the present invention is to provide, with due consideration to the drawbacks of such conventional methods, a method for producing a conductive oxide pattern which has a low resistivity and is easily produced.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

Figure 1:
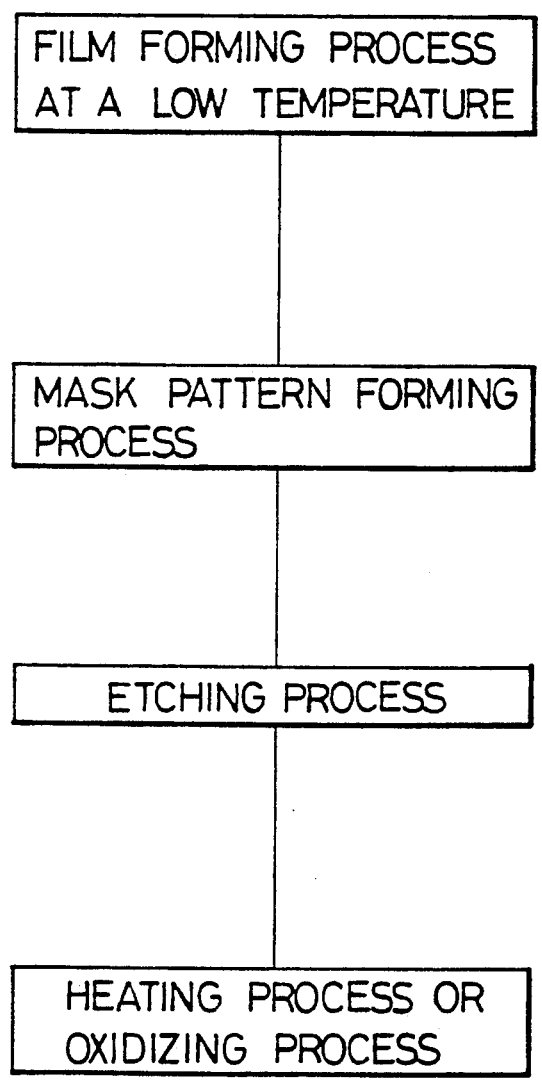
FIG. 1 is an outline of the film-forming process of the present invention.
Figure 2A:
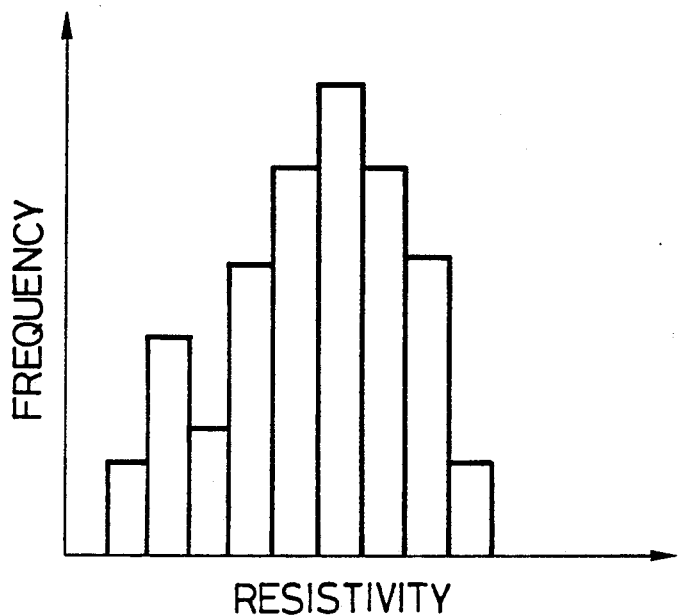
FIGS. 2(A) to 2(D) are a graph to show a comparison of the characteristics of an ITO film formed by the method of the present invention and an ITO film formed by a conventional method, respectively.
Figure 2B:
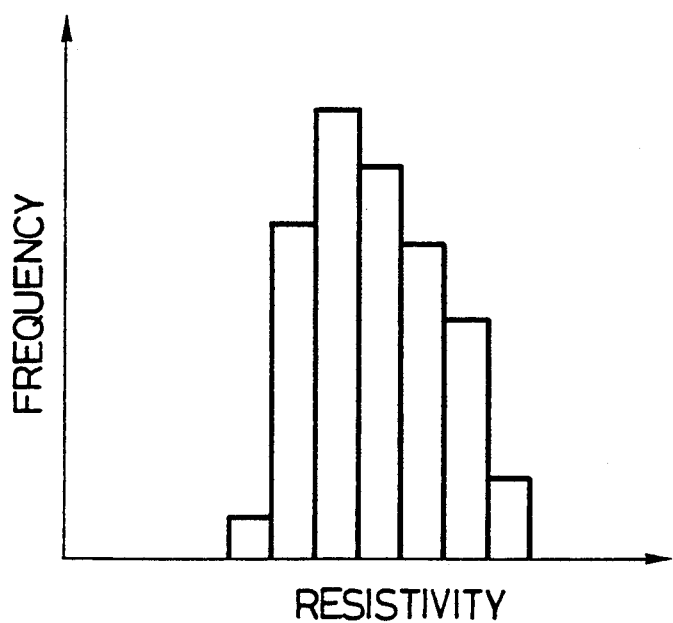
Figure 2C:
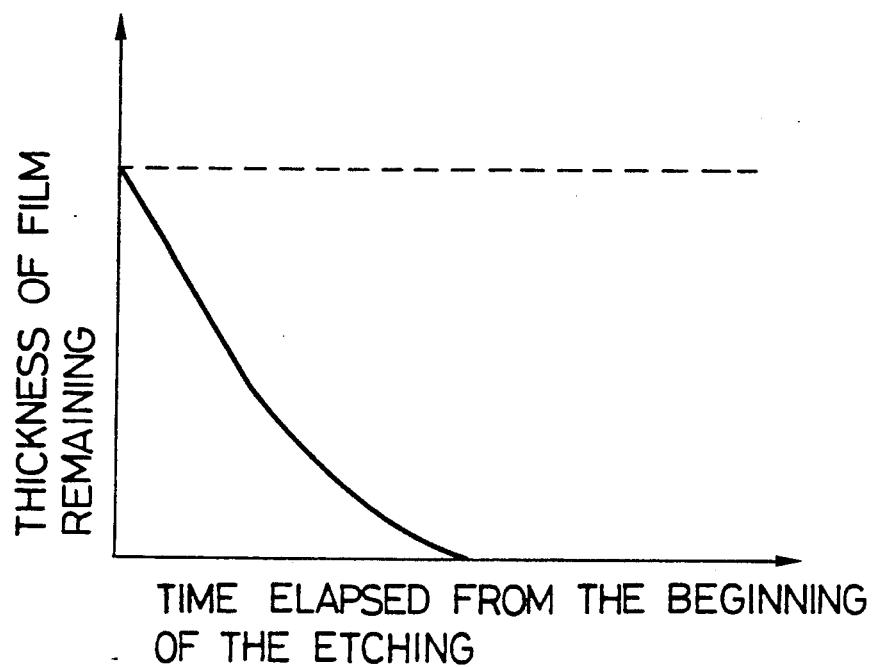
Figure 2D:
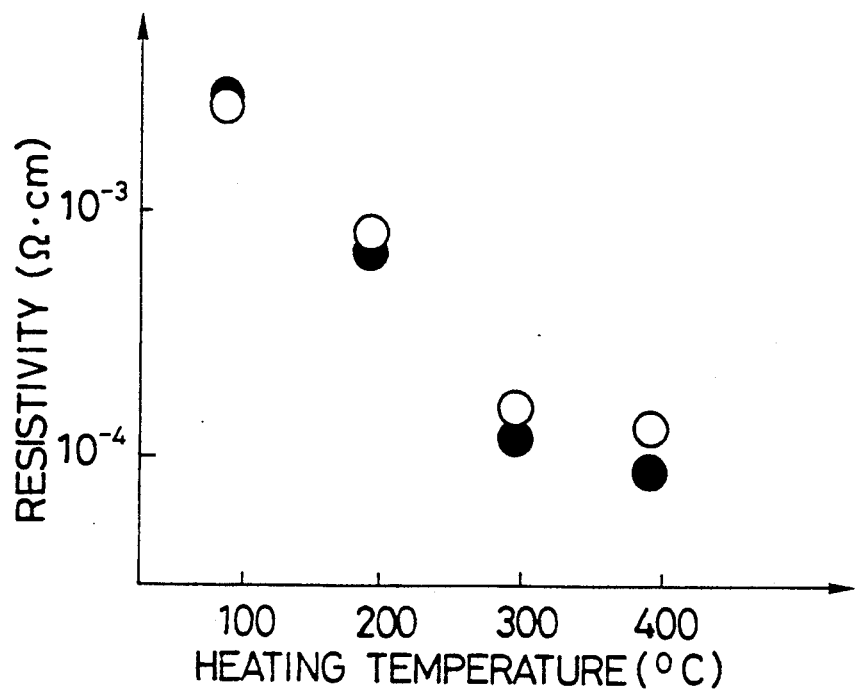

FIG. 1 shows an outline of the film-forming process of the present invention. Following the process order shown in FIG. 1, a conductive oxide film is formed on an insulating substrate by a commonly known vaporizing or sputtering method. At this time, the film is formed without heating or at a low temperature not more than 100° C. This allows a great reduction in the waiting period required in the vaporization or sputtering method. During the formation of the film a quantity of oxygen is introduced into the reaction chamber to give the same partial pressure as required for commonly known conventional methods.

The conductive oxide film obtained by this method is not a complete oxide film, but rather placed in an intermediate state (half-oxide) since the conductive oxide film is formed at the low temperature. The resistivity is higher than by the conventional method, being $1 \times 10^{-3}$ $\Omega \cdot$cm or greater. It takes much less time to form a conductive oxide pattern in the present invention than in the conventional method because the conductive oxide film is formed at a lower temperature in the present invention than in the conventional method. A large device is not required and reproducibility is vastly improved. In the vapor deposition method, electrical energy may be imparted to the introduced oxygen vapor to create a plasma for reactive vaporing.

In the case where the film is formed by the sputtering method in which a target is sputtered, the distance between the sputtered target and the substrate must be suitably changed because the substrate is heated by radiant heat generated in the sputtered target.

When the film is formed by the CVD method at normal pressure, a temperature of 100° to 300° C. is necessary to cause the raw material vapor to undergo a decomposition reaction. In this case, some means is required to heat the raw material vapor so that the substrate itself is heated as little as possible.

Next, in using commonly known photolithography technology a resist pattern is formed from masking material on the conductive oxide film, followed by wet etching using the resist as a mask. Because the conductive oxide film is in the intermediate state(half-oxide), the conductive oxide film has an etching speed ten times as fast as the conventional conductive oxide film. Therefore an HCl etchant even at room temperature etches the conductive oxide film. Because the etchant has a weak etching capability and the etching rate is high, an edge of a pattern after the etching is extremely fine.

Next, the patterned conductive oxide film is placed for 10 to 180 min. in a high temperature oven maintained at 100° to 400° C. An atmosphere within this oven is preferably an oxygen atmosphere or an air atmosphere. In place of the oxygen or the air atmosphere the patterned conductive oxide film may be placed in a high temperature oven of a nitrogen atmosphere containing oxygen 5–10% under a reduced pressure. After the conductive oxide film in the intermediate state(half-oxide) is oxidized, it has a resistivity in the $1.0 \times 10^{-4}$ $\Omega \cdot cm$ to $3.5 \times 10^{-4}$ $\Omega \cdot cm$ range.

Use of the present invention makes possible the formation of an ITO(indium tin oxide) film with low resistivity and good reproducibility. And in the present invention a weak etchant can be used in the etching process.

The characteristics of an ITO film formed by the method of the present invention and an ITO film formed by a conventional method are compared in FIG. 2. FIG. 2(a) and FIG. 2(b) are histograms showing reproducibility. The axis of abscissa is resistivity and the axis of ordinate is frequency, that is the count corresponding to the number of samples. FIG. 2(a) gives the results for the conventional method and FIG. 2(b) the method of the present invention. FIG. 2(c) shows the etching velocity. The axis of ordinate gives the thickness of film remaining when the conductive oxide film is etched by HCl at 25° C., while the axis of abscissa gives the time elapsed from the beginning of the etching. The solid line applies to the film of the present invention, the dotted line to a conventional film. The film of the present invention is clearly superior. FIG. 2(d) shows heating temperatures in °C. along the axis of abscissa versus resistivities in $\Omega \cdot cm$ along the axis of ordinate. The solid dots represent the film of the conventional method while the open dots indicate the film of the present invention. Except for a slightly lower resistivity in the conventional film, there is very little difference between the two.

As described above, the ITO film of the present invention shows an improved reproducibility and the almost same resistivity as the conventional film and the ITO film can easily be etched.

EMBODIMENT NO. 1

Figure 3A:
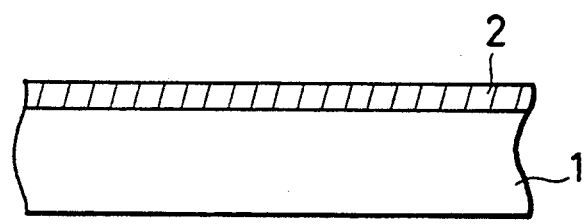
FIGS. 3(A) to 3(C), FIG. 4 and FIG. 5 are a partial cross sectional view to show an embodiment of the present invention, respectively.
Figure 3B:
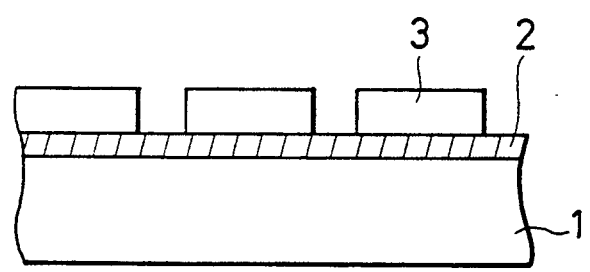
Figure 3C:
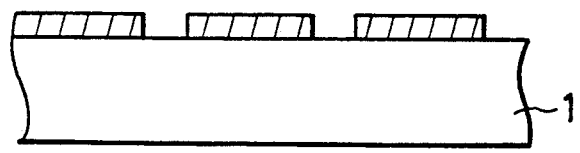

Now referring to FIG. 3, a first embodiment of the present invention will be described. First, a 1500 Å half-oxide ITO film 2 was formed on a translucent, insulating substrate 1 using a commonly known DC magnetron sputtering process. The film forming conditions are given in the following table 1.

TABLE 1

| | |
|---|---|
| ITO target | $SnO_2$ 10 wt % incl. |
| Back pressure | $1 \times 10^{-6}$ Torr |
| $O_2$ partial pressure | $3 \times 10^{-4}$ Torr |
| Sputtering pressure | $1 \times 10^{-2}$ Torr |
| Current | 1.5 mA/cm$^2$ |
| Voltage | 450 V |
| Substrate temperature | 27° C. |

The interval between the substrate and the target was 150 mm. An ITO film with a resistivity of $1.2 \times 10^{-3}$ $\Omega \cdot cm$ was obtained.

Next, using conventional photolithography technology, a resist 3 was patterned to an L/S (line and space)=350/40 (micro meters). The substrate was then submerged in 6 normality HCl at 23° C. for two minutes, and an etching of the ITO film with a thickness of 1500 Å was completed in 1 minute and 30 seconds. The etching rate was 1500 Å/1.5 min., i.e., 1000 Å/min. The resist was removed by using a conventional exfoliation liquid to give the condition illustrated in FIG. 3(c). The substrate was then heated in a clean oven (in an atmosphere of air) at 200° C. for 60 minutes to obtain a sheet resistance of 14 $\Omega/cm^2$. In this way a fabrication of a liquid crystal display substrate of the size of an A-4 sheet (640 dots × 400 dots) was completed.

After the completion, the resistivity of the ITO film was measured as $1.6 \times 10^{-4}$ $\Omega \cdot cm$.

EMBODIMENT NO. 2

Figure 4:
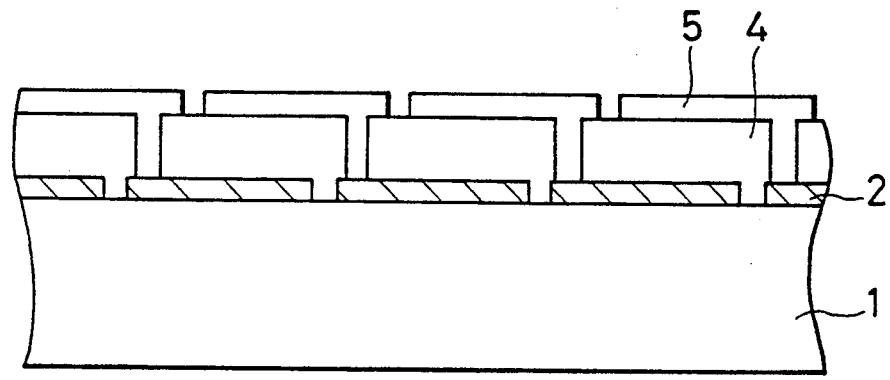

FIG. 4 shows a second embodiment of the present invention. A 1200 Å half-oxide film 2 of tin oxide was formed on a soda glass substrate 1 using a commonly known electron beam(EB) vaporization device. The film forming conditions are given in the following table 2.

TABLE 2

| | |
|---|---|
| Vaporization Source | $SnO_2$ pellet |
| Back pressure | $1 \times 10^{-6}$ Torr |
| Oxygen partial pressure | $3 \times 10^{-4}$ Torr |
| EB acceleration voltage | 10 KV |
| Mission current | 100 mA |
| Substrate temperature | 50° C. |

Under these conditions, a tin oxide film with a resistivity of $4.2 \times 10^{-3}$ $\Omega \cdot cm$ was obtained.

Next, using conventional photolithography technology, the tin oxide film was patterned. At this time, an etching of the tin oxide film with a thickness of 1200 Å was complete in 20 seconds at 23° C.

Following this, a plasma ashing process was performed on the substrate under an atmosphere of oxygen to remove the photoresist. Subsequently, in the same device used for the plasma ashing process, the tin oxide, which was in the form of an incompletely oxidized conductive film, was oxidized by a heat treatment for oxygen plasma treatment. Because this oxidizing heat treatment was assisted by plasma energy, the time required for the treatment was only about ⅓ that required under a normal oxidizing vapor atmosphere. It was therefore possible to reduce the resistivity value of the conductive layer to less than $2.5 \times 10^{-4}$ $\Omega \cdot cm$.

Also, performing the heat treatment of the substrate simultaneously with the ashing process had the effect of further shortening the treatment time.

Next, an a-Si film 4 comprising P-, I-, and N-layers of 100 Å, 7000 Å, and 300 Å respectively was formed using a commonly known plasma CVD process. The a-Si layer was patterned using commonly known photolithography technology, and an electrode 5 was formed on the rear side surface to provide a 12-series amorphous silicon solar cell as illustrated in FIG. 4.

EMBODIMENT NO. 3

Figure 5:
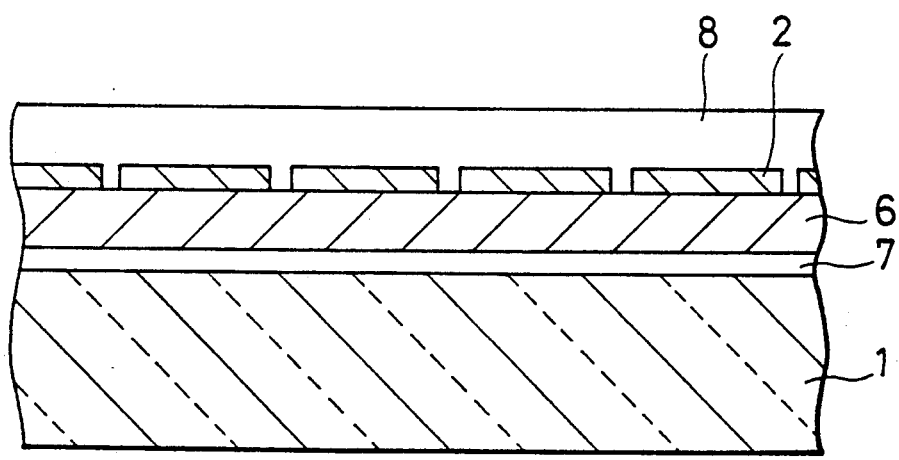

FIG. 5 shows a third embodiment of the present invention. A chromium electrode was formed as a film of 1000 Å in thickness on a borosilicate glass substrate 1 using a commonly known DC magnetron sputtering process and a P-type a-SiC layer with a thickness of 3000 Å was formed on the chromium electrode and an I-type a-SiC layer with a thickness of 10000 Å was formed on the P-type a-Sic layer and an N-type a-SiC layer with a thickness of 300 Å was formed on the I-type a-SiC layer to thus form a semiconductor layer(6) by using a commonly known plasma CVD process. Following this, half-oxide ITO film 2 of a 1500 Å was formed using a commonly known DC magnetron sputtering process. The film forming conditions are given in the following table 3.

TABLE 3

| ITO Target | $SnO_2$ 5 wt % incl. |
|---|---|
| Back pressure | $1 \times 10^{-6}$ Torr |
| $O_2$ partial pressure | $5 \times 10^{-4}$ Torr |
| Sputtering pressure | $1 \times 10^{-2}$ Torr |
| Current | 1.5 mA/cm$^2$ |
| Voltage | 450 V |
| Substrate temperature | 27° C. |

Under these conditions, an ITO film with a resistivity of $1.5 \times 10^{-3}$ Ω·cm was obtained.

Next, using conventional photolithography technology, the ITO film was patterned. At this time an etching of the half-oxide ITO film of a 1500 Å was completed in 50 seconds at 23° C. using 2 normality HCl. Then liquid $SiO_2$ was applied as a protective film using a commonly-known SOG method.

Baking the $SiO_2$ protective film and oxidizing the ITO film are performed in one step in a clean oven under an atmosphere of air at 300° C. for 120 minutes. In this way, a sensor section for a one-dimensional contact image sensor was prepared. The resistivity of the ITO at this time was $2.0 \times 10^{-4}$ Ω·cm. When a protective film 8 was formed of SiN rather than $SiO_2$, the substrate temperatures during film formation were in the range of 200° to 300° C., so that the oxidation proceeded. In the case where a polyimide film was used as the protective film, the polyimide film was formed at a baking temperature not less than 200° C. and therefore forming the polyimide film and oxidizing the ITO film are performed in one step in the same manner as described above.

By utilizing the method of the present invention, a conductive oxide film with low resistivity can be easily produced at low cost. In addition, an improvement in the sharpness of the pattern edge after the etching process is also obtained. As a result, a low cost conductive oxide film pattern can be formed on a large-area substrate with good reproducibility.

Since other modification and changes (varied to fit particular operating requirements and environments) will be apparent to those skilled in the art, the invention is not considered limited to the examples chosen for purposes of disclosure, and covers all changes and modifications which do not constitute departures from the true spirit and scope of this invention.

What is claimed is:

1. A method for producing a conductive oxide pattern comprising:
   forming a conductive oxide layer on an insulating substrate;
   patterning said conductive oxide layer; and
   oxidizing the patterned conductive oxide layer.

2. The method for producing a conductive oxide pattern in claim 1 wherein the temperature of said substrate is not more than 100° C. when said forming step is performed.

3. The method for producing a conductive oxide pattern in claim 2 wherein said oxidizing step is performed at a temperature in the range of 100° to 400° C.

4. A method for producing a conductive oxide pattern comprising the steps of:
   forming a conductive oxide layer on a substrate at a substrate temperature not higher than 100° C.;
   forming a mask pattern on said conductive oxide layer;
   etching a portion of said conductive oxide layer with an etchant consisting essentially of hydrochloric acid in order to leave a portion of said conductive oxide layer under said mask pattern remaining;
   removing said mask pattern; and
   oxidizing the remaining portion of said conductive oxide layer to produce said conductive oxide pattern.

5. The method for producing a conductive oxide pattern in claim 4 wherein said mask pattern is a photoresist pattern.

6. The method for producing a conductive oxide pattern in claim 5 wherein said oxidizing step is performed at a temperature in the range of 100° C. to 400° C.

7. The method for producing a conductive oxide pattern in claim 6 wherein the concentration of said hydrochloric acid is not more than 6 normality.

8. The method for producing a conductive oxide pattern in claim 4 wherein said conductive oxide pattern is made of indium tin oxide.

9. The method for producing a conductive oxide pattern in claim 4 wherein said conductive oxide pattern is made of tin oxide.

10. A method for producing a conductive oxide pattern comprising the steps of:
    forming a conductive oxide layer on a substrate at a substrate temperature not higher than 100° C.;
    forming a mask pattern on said conductive oxide layer;
    etching a portion of said conductive oxide layer with an etchant consisting essentially of hydrochloric acid in order to leave a portion of said conductive oxide layer under said mask pattern remaining;
    removing said mask pattern by a plasma ashing with said substrate heated;
    oxidizing the remaining portion of said conductive oxide layer,
    wherein said removing step and said oxidizing step are sequentially performed in a common reaction container with an oxygen containing plasma.

11. The method for producing a conductive oxide pattern in claim 10 wherein said mask pattern is a photoresist pattern.

12. The method for producing a conductive oxide pattern in claim 11 wherein the temperature of said substrate is not more than 100° C. when said conductive oxide layer is formed.

13. The method for producing a conductive oxide pattern in claim 10 wherein the oxidized conductive oxide layer is made of tin oxide.

14. The method for producing a conductive oxide pattern in claim 11 wherein said removing step is performed in an oxidizing atmosphere.

15. A method for producing a conductive oxide pattern comprising the steps of:
    forming a conductive oxide layer on a substrate;
    forming a mask pattern on said conductive oxide layer;
    etching a portion of said conductive oxide layer in order to leave a portion of said conductive oxide layer under said mask pattern remaining;
    removing said mask pattern; and
    forming a second layer on said substrate and the remaining portion of said conductive oxide layer; wherein the formation of said second layer includes a step of heating said substrate in an oxidizing atmosphere so that said conductive oxide layer is simultaneously oxidized.

16. The method for producing a conductive oxide pattern in claim 15 wherein said etching step is performed utilizing a hydrochloric acid.

17. The method for producing a conductive oxide pattern in claim 16 wherein said mask pattern is a photoresist pattern.

18. The method for producing a conductive oxide pattern in claim 17 wherein the temperature of said substrate is not more than 100° C. when said conductive oxide layer is formed.

19. The method for producing a conductive oxide pattern in claim 18 wherein the concentration of said hydrochloric acid is not more than 6 normality.

20. The method for producing a conductive oxide pattern in claim 16 wherein the oxidized conductive oxide layer is made of indium tin oxide.

21. A method according to claim 15 wherein said second layer comprises a material selected from the group consisting of silicon oxide, silicon nitride and polyimide.

* * * * *